(12) United States Patent
Swoboda et al.

(10) Patent No.: US 12,097,641 B2
(45) Date of Patent: *Sep. 24, 2024

(54) METHOD FOR FORMING A CRACK IN AN EDGE REGION OF A DONOR SUBSTRATE

(71) Applicant: Siltectra GmbH, Dresden (DE)

(72) Inventors: Marko David Swoboda, Dresden (DE); Christian Beyer, Freiberg (DE); Franz Schilling, Radeberg (DE); Jan Richter, Dresden (DE)

(73) Assignee: Siltectra GmbH, Dresden (DE)

(*) Notice: Subject to any disclaimer, the term of this patent is extended or adjusted under 35 U.S.C. 154(b) by 410 days.

This patent is subject to a terminal disclaimer.

(21) Appl. No.: 17/214,256

(22) Filed: Mar. 26, 2021

(65) Prior Publication Data

US 2021/0213643 A1 Jul. 15, 2021

Related U.S. Application Data

(63) Continuation of application No. 15/739,969, filed as application No. PCT/EP2016/064536 on Jun. 23, 2016, now Pat. No. 10,994,442.

(30) Foreign Application Priority Data

Jun. 23, 2015 (DE) .......................... 102015008034.2

(51) Int. Cl.
*B28D 1/22* (2006.01)
*B23K 26/00* (2014.01)
(Continued)

(52) U.S. Cl.
CPC .......... *B28D 1/221* (2013.01); *B23K 26/0006* (2013.01); *B23K 26/53* (2015.10);
(Continued)

(58) Field of Classification Search
CPC .. B28D 1/221; B28D 5/0005; B81C 1/00634; C03B 33/0222; C03B 33/091;
(Continued)

(56) References Cited

U.S. PATENT DOCUMENTS 7,052,978 B2 * 5/2006 Shaheen ................ B23K 26/40
438/460
8,440,129 B2 5/2013 Lichtensteiger et al.
(Continued)

FOREIGN PATENT DOCUMENTS

DE 102013113030 A1 10/2014
DE 102013007673 A1 11/2014
(Continued)

OTHER PUBLICATIONS

EP-3147068-A1 english translation; Mar. 29, 2017; Richter J.*
JP-2008201143-A english translation; Sep. 4, 2008 JP Azuma, Terukazu.*

*Primary Examiner* — Laura M Lee
(74) *Attorney, Agent, or Firm* — Murphy, Bilak & Homiller, PLLC

(57) ABSTRACT

A method for separating a solid-body layer from a donor substrate includes providing a donor substrate having a planar surface, a longitudinal axis orthogonal to the planar surface, and a peripheral surface, and producing modifications within the donor substrate using at least one LASER beam. The at least one LASER beam penetrates the donor substrate via the peripheral surface at an angle not equal to 90° relative to the longitudinal axis of the donor substrate. The method further includes producing a stress-inducing polymer layer on the planar surface of the donor substrate, and producing mechanical stresses in the donor substrate by a thermal treatment of the stress-inducing polymer layer. The mechanical stresses produce a crack for separating the
(Continued)

solid-body layer, and wherein the crack propagates along the modifications.

19 Claims, 8 Drawing Sheets

(51) Int. Cl.
| | |
|---|---|
| *B23K 26/53* | (2014.01) |
| *B23K 101/40* | (2006.01) |
| *B28D 5/00* | (2006.01) |
| *B81C 1/00* | (2006.01) |
| *C03B 33/02* | (2006.01) |
| *C03B 33/09* | (2006.01) |
| *H01L 21/02* | (2006.01) |
| *H01L 21/268* | (2006.01) |
| *H01L 21/304* | (2006.01) |
| *H01L 21/762* | (2006.01) |
| *H01L 31/18* | (2006.01) |

(52) U.S. Cl.
CPC ........ *B28D 5/0005* (2013.01); *B81C 1/00634* (2013.01); *C03B 33/0222* (2013.01); *H01L 21/02005* (2013.01); *H01L 21/268* (2013.01); *H01L 21/304* (2013.01); *H01L 31/1804* (2013.01); *H01L 31/1896* (2013.01); *B23K 2101/40* (2018.08); *C03B 33/091* (2013.01); *H01L 21/76251* (2013.01)

(58) Field of Classification Search
CPC ............. H01L 21/02005; H01L 21/268; H01L 21/304; H01L 21/76251; H01L 31/1896; H01L 31/1804; B23K 2101/40
See application file for complete search history.

(56) References Cited

U.S. PATENT DOCUMENTS

| | | | |
|---|---|---|---|
| 8,835,802 B2 * | 9/2014 | Baer | ...................... B23K 26/53 |
| | | | 219/121.64 |
| 8,877,077 B2 | 11/2014 | Lichtensteiger | |
| 10,843,380 B2 * | 11/2020 | Schilling | ............. B81C 1/00357 |
| 10,994,442 B2 * | 5/2021 | Swoboda | ............... H01L 21/268 |
| 11,377,758 B2 * | 7/2022 | Baer | ...................... C30B 33/06 |
| 2006/0124615 A1 * | 6/2006 | Azuma | ................... B23K 26/04 |
| | | | 219/121.67 |
| 2008/0012140 A1 | 1/2008 | Tsukano et al. | |
| 2009/0056513 A1 | 3/2009 | Baer | |
| 2011/0120531 A1 * | 5/2011 | Nese | ................... H01L 31/1804 |
| | | | 136/251 |
| 2011/0259936 A1 | 10/2011 | Lichtensteiger | |
| 2014/0053382 A1 | 2/2014 | Yang | |
| 2015/0159279 A1 | 6/2015 | Munoz | |
| 2016/0059349 A1 * | 3/2016 | Sercel | ................... B23K 26/402 |
| | | | 65/32.1 |
| 2017/0217048 A1 | 8/2017 | Richter et al. | |
| 2018/0118562 A1 | 5/2018 | Drescher et al. | |
| 2018/0370073 A1 | 12/2018 | Swoboda et al. | |
| 2019/0099838 A1 * | 4/2019 | Rieske | ................... B23K 26/40 |
| 2020/0215648 A1 * | 7/2020 | Swoboda | ............. B23K 26/146 |
| 2021/0197314 A1 * | 7/2021 | Swoboda | .......... H01L 21/02005 |

FOREIGN PATENT DOCUMENTS

| | | | | |
|---|---|---|---|---|
| DE | 102014014486 A1 | | 4/2015 | |
| EP | 3147068 A1 * | | 3/2017 | ......... B23K 26/1224 |
| JP | 2008201143 A * | | 9/2008 | ............... B28D 5/00 |
| TW | 200933703 A | | 8/2009 | |
| TW | 201446454 A | | 12/2014 | |
| WO | 2009061353 A2 | | 5/2009 | |
| WO | 2010072675 A2 | | 7/2010 | |
| WO | 2016050596 A1 | | 4/2016 | |

* cited by examiner

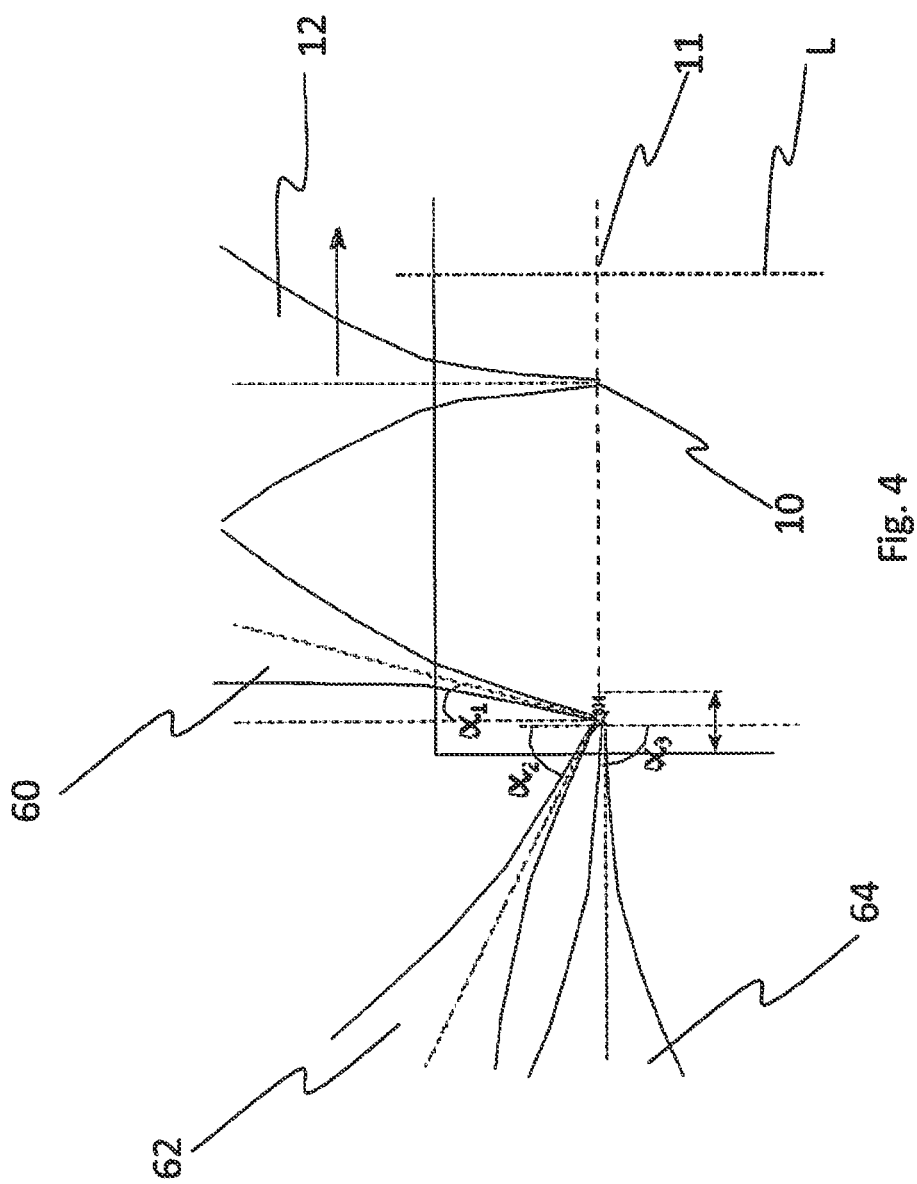

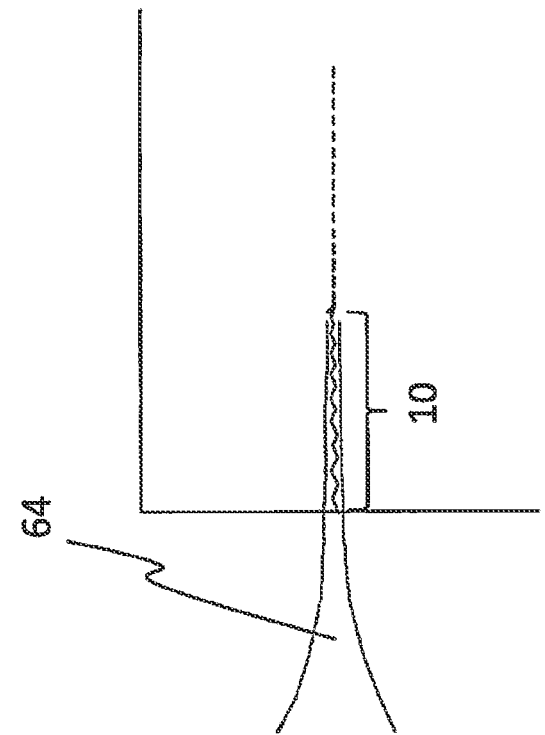
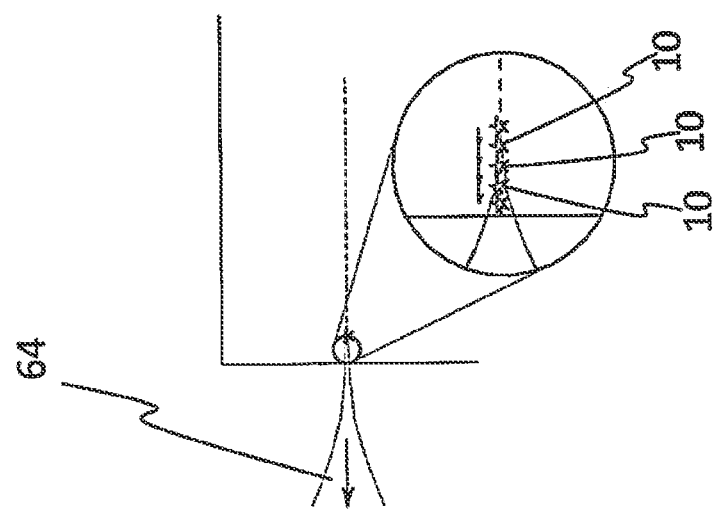
Fig. 6b
Fig. 6a

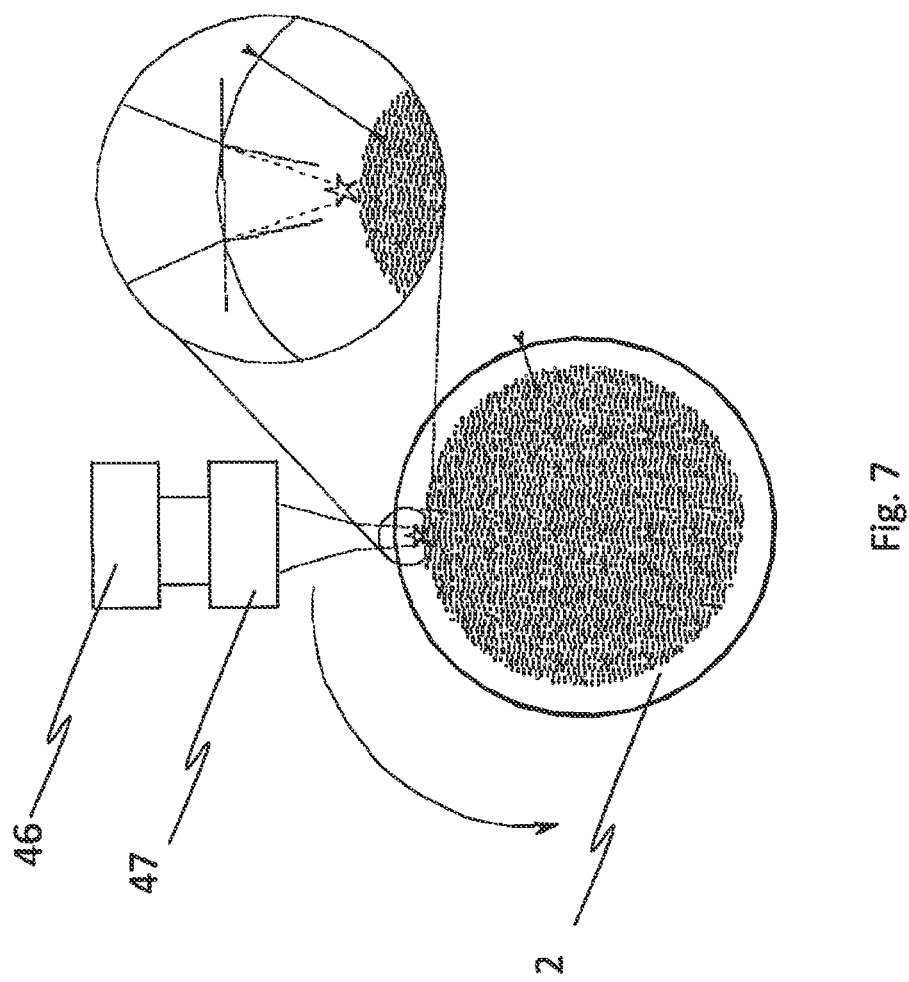

METHOD FOR FORMING A CRACK IN AN EDGE REGION OF A DONOR SUBSTRATE

TECHNICAL FIELD

The present invention relates to a method for separating solid-body slices from a donor substrate.

BACKGROUND

In many technical fields (for example microelectronics or photovoltaic technology), materials such as silicon, germanium or sapphire are often used in the form of thin slices and plates (what are known as wafers). As standard, wafers of this kind are currently produced by sawing from an ingot, with relatively large material losses ("kerf loss") being sustained. Since the used starting material is often very costly, it is highly sought to produce wafers of this kind with less material consumption, and therefore more efficiently and more economically.

By way of example, with the currently conventional methods, almost 50% of the used material is lost as "kerf loss" in the production of silicon wafers for solar cells alone. Considered globally, this corresponds to an annual loss of more than 2 billion euros. Since the costs of the wafer account for the largest share of the cost of the finished solar cell (over 40%), the costs of solar cells could be significantly reduced by corresponding improvements in the wafer production.

Methods which dispense with the conventional sawing and for example can directly split off thin wafers from a thicker workpiece by use of temperature-induced stresses appear to be particularly attractive for wafer production of this kind without kerf loss ("kerf-free wafering"). These include in particular methods as described for example in PCT/US2008/012140 and PCT/EP2009/067539, where a polymer layer applied to the workpiece is used in order to produce these stresses.

With use of the methods according to the prior art, the produced wafers usually have greater thickness variations, wherein the spatial thickness distribution often presents a pattern having tetramerous symmetry. The total thickness variation (TTV) as considered over the entire wafer, with use of the previous methods, is often more than 100% of the average wafer thickness (a wafer for example of 100 micrometres average thickness, which for example at its thinnest point is 50 micrometres thick and at its thickest point is 170 micrometres thick, has a TTV of 170−50=120 micrometres, which corresponds to a total thickness variation of 120% relative to its average thickness). Wafers with high thickness variations of this kind are not suitable for many applications. In addition, in the most frequently occurring tetramerous thickness distribution patterns, the regions with the greatest fluctuations are disposed unfortunately in the middle of the wafer, where they are the most disruptive.

Here, crack formation is particularly critical, since solid-body slices with a low TTV can be directly produced only with very precise crack formation.

It has been found that modifications for specifying the course of the crack at a distance from the edge of the solid body can indeed be produced in a solid body by means of LASER beams, however this is not readily possible in the region of the edge of a solid body on account of edge effects. If the middle of the LASER focus directly contacts the edge of the material, one half of the beam thus contacts the solid body with finite extent, and the other half runs into the air. On account of the difference in refractive index, this causes damage at the side of the solid body, way beyond the actually intended damage layer after refractive index correction. Since, in addition, only half or a fraction of the LASER radiation is coupled into the material, the damage at the edge is reduced compared to in the middle of the solid body. This reduced damage causes the crack to be distorted over its course at the edge or means that the crack does not progress in the laser plane.

SUMMARY

The object of the present invention is therefore to provide a method that enables the production of wafers having a low TTV.

The aforementioned object is achieved in accordance with the invention by a method for separating solid-body slices from a donor substrate. The method according to the invention preferably comprises at least the following steps: providing a donor substrate, producing at least one modification within the donor substrate by means of at least one LASER beam, wherein the LASER beam penetrates the donor substrate via a planar surface of the donor substrate, wherein the LASER beam is inclined with respect to the planar surface of the donor substrate such that it penetrates the donor substrate at an angle of not equal to 0° or 180° relative to the longitudinal axis of the donor substrate, wherein the LASER beam is focused in order to produce the modification in the donor substrate, wherein the solid-body slice detaches from the donor substrate as a result of the modifications produced, or a stress-inducing layer is produced or arranged on the planar surface of the donor substrate and mechanical stresses are produced in the donor substrate by a thermal treatment of the stress-inducing layer, wherein the mechanical stresses produce a crack for separating a solid-body layer, which crack propagates along the modifications. A first portion of the LASER beam preferably penetrates the donor substrate at a first angle to the planar surface of the donor substrate, and at least one further portion of the LASER beam penetrates the donor substrate at a second angle to the planar surface of the donor substrate, wherein the value of the first angle differs from the value of the second angle, wherein the first portion of the LASER beam and the further portion of the LASER beam are focused in order to produce a modification in the donor substrate.

The donor wafer and/or the LASER device emitting the LASER beams are/is preferably rotated about an axis of rotation during the production of the modifications. Additionally or alternatively to the rotation of the donor wafer, there is particularly preferably a change to the distance of the LASER beams from the centre of the donor wafer.

The totality of LASER beams, in accordance with a further preferred embodiment of the present invention, is oriented in the same orientation relative to the planar surface of the donor substrate for the production of modifications in the region of the centre of the donor substrate and for the production of modifications in the region of an edge of the donor substrate provided in the radial direction.

This solution is advantageous since the total cross-section of the LASER beam upon entry into the solid body contacts a planar surface, and since homogeneous damage then occurs in the depth. This homogeneous damage can be produced as far as the outer edge of the donor substrate extending in particular orthogonally to the planar surface.

The modifications in the edge region of the donor substrate and in the region of the centre of the donor substrate can thus be produced by means of one processing step.

In accordance with a further preferred embodiment of the present invention the first portion of the LASER beams penetrates the donor substrate at a first angle to the surface of the donor substrate and the further portion of the LASER beams penetrates at a second angle for production of modifications in the region of the centre of the donor substrate and for production of modifications in the region of an edge of the donor substrate provided in the radial direction, wherein the value of the first angle always differs from the value of the second angle. The first angle and the second angle are preferably constant or unchanged or are not actively changed during the production of the modifications.

The aforementioned object is alternatively achieved by a method for separating solid-body slices from a donor substrate, this method in this case preferably comprising at least the following steps: providing a donor substrate, removing material from the donor substrate starting from a surface extending in the peripheral direction of the donor substrate in the direction of the centre of the donor substrate in order to produce an indentation, wherein the material is removed by means of ablation LASER beams and/or the indentation is produced asymmetrically, producing modifications by means of further LASER beams within the donor substrate, wherein the modifications are positioned in such a way that they adjoin the indentation, wherein the solid-body slice detaches from the donor substrate as a result of the modifications produced or a stress-inducing layer is produced or arranged on a surface, in particular a planar surface, oriented at an incline relative to the peripheral surface, and mechanical stresses are produced in the donor substrate by a thermal treatment of the stress-inducing layer, wherein the mechanical stresses produce a crack for separating a solid-body layer, which crack propagates along the modifications starting from the indentation.

The modifications are achieved here preferably using the shortest possible pulses in the smallest possible vertical region by focusing in the material with a high numerical aperture.

During the ablation, the ablation LASER beams are focused on the surface of the material with a lower numerical aperture and often a wavelength absorbed linearly by the material. The linear absorption of the ablation LASER beams at the material surface leads to an evaporation of the material (the ablation), i.e. to a material removal, and not only to a structural change.

This solution is advantageous since an edge region of the donor substrate is processed by means of a material-removing treatment, by means of which the outer edge of the donor substrate is displaced, in the region of the plane in which the crack propagates, towards the centre of the donor substrate. The displacement preferably occurs in the direction of the centre to such an extent that all LASER beams can penetrate the donor substrate over the same planar surface, depending on the penetration depth of the LASER beams and/or the angle of the LASER beams to one another.

Further preferred embodiments are disclosed in the following parts of the description.

The indentation surrounds the donor substrate, in accordance with a further preferred embodiment of the present invention, completely in the peripheral direction. This embodiment is advantageous since the crack can be introduced into the donor substrate in a defined manner over the entire periphery of the donor substrate.

In accordance with a further preferred embodiment of the present invention, the indentation runs towards the centre as far as an indentation end that becomes increasingly narrower, in particular in a wedge-like or V-shaped manner, wherein the indentation end lies in the plane in which the crack propagates. This embodiment is advantageous since a notch is created by the indentation end, which notch predefines the direction of propagation of the crack.

The asymmetric indentation, in accordance with a further preferred embodiment of the present invention, is produced by means of a grinding tool, which is negatively shaped at least in part in order to make the indentation. This embodiment is advantageous since the grinding tool can be produced in accordance with the edge or indentation to be formed.

In accordance with a further preferred embodiment of the present invention, the grinding tool has at least two differently shaped processing portions, wherein a first processing portion is intended for processing of the donor substrate in the region of the underside of a solid-body slice to be separated and a second processing portion is intended for processing of the donor substrate in the region of the upper side of the solid-body slice to be separated from the donor substrate. This embodiment is advantageous since, in addition to shapings for improved crack formation, shapings for improved handling can also be produced by means of the grinding tool at the same time or at a different time on the donor substrate or on the portions of the donor substrate forming one or more solid-body slices.

In accordance with a further preferred embodiment of the present invention, the first processing portion produces a deeper or larger-volume indentation in the donor substrate than the second processing portion, wherein the first processing portion and/or the second processing portion have/has curved or straight grinding faces. The first processing portion preferably has a curved main grinding face and the second processing portion preferably likewise has a curved secondary grinding face, wherein the radius of the main grinding face is greater than the radius of the secondary grinding face, the radius of the main grinding face is preferably at least twice as large as the radius of the secondary grinding face, or the first processing portion has a straight main grinding face and the second processing portion has a straight secondary grinding face, wherein, by means of the main grinding face, more material is removed from the donor substrate than with the secondary grinding face, or the first processing portion has a straight main grinding face and the second processing portion has a curved secondary grinding face, or the first processing portion has a curved main grinding face and the second processing portion has a straight secondary grinding face.

The grinding tool preferably has a multiplicity of processing portions, in particular more than 2, 3, 4, 5, 6, 7, 8, 9 or 10 processing portions, in order to process a corresponding multiplicity of portions of the donor substrate, which can be associated with different solid-body slices, in a machining or material-removing manner.

In accordance with a further preferred embodiment of the present invention, the ablation LASER beams are produced with a wavelength in the range between 300 nm (UV ablation with frequency-tripled Nd: YAG or other solid-body laser) and 10 μm ($CO_2$ glass laser, often used for engraving and cutting processes), with a pulse length of less than 100 microseconds and preferably less than 1 microsecond, and particularly preferably less than $\frac{1}{10}$ of a microsecond, and with a pulse energy of more than 1 μJ and preferably more than 10 μJ. This embodiment is advantageous since the indentation can be produced by means of a LASER device and not by means of a grinding tool, which becomes worn.

The modifications in the donor substrate are produced in a material-dependent manner preferably with the following configurations or LASER parameters: If the donor substrate consists of silicon or the donor substrate comprises silicon, then nanosecond pulses or shorter (<500 ns), a pulse energy in the microjoule range (<100 µJ), and a wavelength >100 nm are preferably used.

In the case of all other materials and material combinations, a pulse <5 picoseconds, pulse energies in the microjoule range (<100 µJ), and wavelengths variable between 300 nm and 2500 nm are preferably used.

It is important here that a large aperture is provided in order to pass deep into the material. The aperture for producing the modifications within the donor substrate is therefore preferably larger than the aperture for ablation of material by means of the ablation LASER beams for producing the indentation. The aperture is preferably multiple times larger, in particular at least 2, 3, 4, 5 or 6 times larger, than the aperture for ablation of material by means of the ablation LASER beams for producing the indentation. The size of the focus for producing a modification, in particular with regard to the diameter of the focus, is preferably smaller than 10 µm, preferably smaller than 5 µm, and particularly preferably smaller than 3 µm.

In accordance with a further preferred embodiment of the present LASER device comprises invention, the a femto-second LASER (fs LASER) or a picosecond LASER (ps LASER), and the energy of the LASER beams of the LASER (fs LASER or ps LASER) is preferably selected in such a way that the propagation of damage of each modification in the top layer and/or the sacrificial layer is less than 3 times the Rayleigh length, preferably less than the Rayleigh length, and particularly preferably less than a third of the Rayleigh length and/or the wavelength of the LASER beams of the fs LASER is selected in such a way that the absorption of the top layer and/or of the sacrificial layer is less than 10 cm 1 and preferably less than 1 cm$^{-1}$ and particularly preferably less than 0.1 cm$^{-1}$ and/or the individual modifications are produced in each case as a result of a multi-photon excitation brought about by the fs LASER.

In accordance with a further preferred embodiment of the present invention the LASER beams for producing the modifications penetrate the donor wafer over a surface that is part of the solid-body slice to be separated. This embodiment is advantageous since the donor substrate is heated to a lesser extent, whereby the donor substrate is exposed only to low thermal stresses.

The stress-inducing layer, in accordance with a further preferred embodiment of the present invention, comprises a polymer, in particular polydimethylsiloxane (PDMS), or consists thereof, wherein the thermal treatment is preferably performed in such a way that the polymer experiences a glass transition, wherein the stress-inducing layer is temperature-controlled, in particular by means of liquid nitrogen, to a temperature below room temperature (i.e. to a temperature below 20° C.) or below 0° C. or below −50° C. or below −100° C. or below −110° C., in particular to a temperature below the glass transition temperature of the stress-inducing layer.

This embodiment is advantageous since it has been found that, due to the thermal treatment of the stress-inducing layer, in particular by utilisation of the property changes of the material of the stress-inducing layer occurring with the glass transition, the forces necessary to initiate and form a crack can be produced in a donor substrate.

The donor substrate preferably comprises a material or a material combination from one of the main groups 3, 4 and 5 of the Periodic Table of Elements, such as Si, SiC, SiGe, Ge, GaAs, InP, GaN, $Al_2O_3$(sapphire), AlN, or consists of one or more of these materials. The donor substrate particularly preferably comprises a combination of elements occurring in the third and fifth group of the Periodic Table of Elements. Conceivable materials or material combinations are for example gallium arsenide, silicon, silicon carbide, etc. Furthermore, the donor substrate can comprise a ceramic (for example $Al_2O_3$—aluminium oxide) or can consist of a ceramic, preferred ceramics being for example perovskite ceramics (such as Pb-, O-, Ti/Zr-containing ceramics) in general, and lead magnesium niobates, barium titanate, lithium titanate, yttrium aluminium garnet, in particular yttrium aluminium garnet crystals for solid-body laser applications, SAW (surface acoustic wave) ceramics, such as lithium niobate, gallium orthophosphate, quartz, calcium titanate, etc., in particular. The donor substrate thus preferably comprises a semiconductor material or a ceramic material, or the donor substrate particularly preferably consists of at least one semiconductor material or a ceramic material. It is also conceivable that the donor substrate comprises a transparent material or partially consists of or is made of a transparent material, such as sapphire. Further materials which can be considered here as solid-body material alone or in combination with another material are for example "wide band gap" materials, InAlSb, high-temperature superconductors, in particular rare earth cuprates (for example YBa2Cu3O7).

The subject matter of patent application DE 2013 205 720.2 with the title: "Method for rounding edges of semiconductor parts produced from a semiconductor starting material, and semiconductor products produced by this method" is hereby incorporated by reference in its full extent in the subject matter of the present description.

The use of the word "substantially" in all cases in which this word is used within the scope of the present invention preferably defines a deviation in the range of 1% to 30%, in particular 1% to 20%, in particular 1% to 10%, in particular 1% to 5%, in particular 1% to 2%, from the definition that would be given without the use of this word.

Further advantages, objectives and properties of the present invention will be explained on the basis of drawings accompanying the following description, in which the solutions according to the invention are illustrated by way of example. Components or elements or method steps of the solutions according to the invention which in the figures coincide at least substantially in terms of their function can be denoted here by the same reference signs, wherein these components or elements do not have to be provided with reference signs or explained in all figures.

BRIEF DESCRIPTION OF THE DRAWINGS

In the drawings:

FIG. 4 shows an illustration that shows the various LASER beam angles;

FIGS. 6a/6b show two illustrations of modification production steps;

FIG. 7 shows production of a modification with an aberration adjustment; and

DETAILED DESCRIPTION

Figure 1:
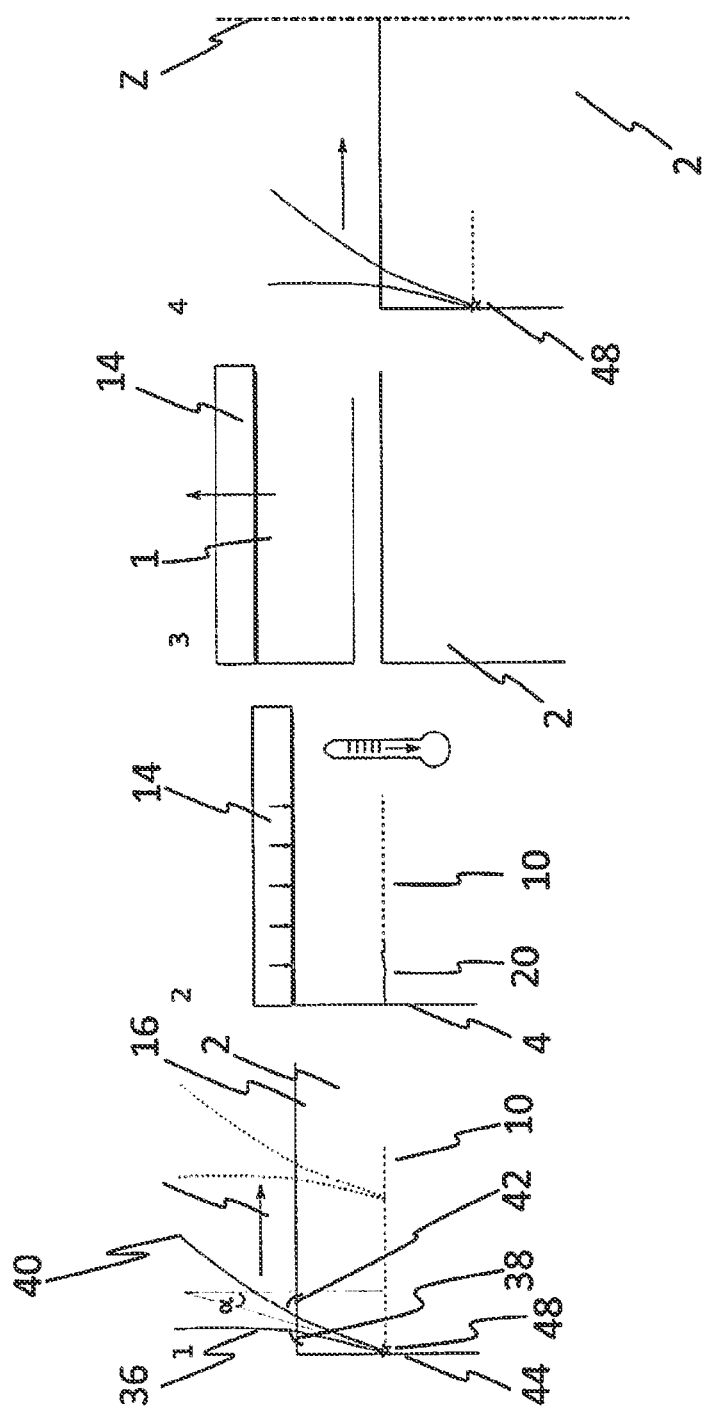
FIG. 1 shows an example of an edge treatment within the scope of the solid-body slice production or solid-body layer production according to the invention.

FIG. 1 shows 4 illustrations. In the first illustration of FIG. 1 a donor substrate 2 is shown that is exposed to LASER beams 12. The LASER beams 12 are inclined in their totality relative to the surface 16 via which the LASER beams penetrate the donor substrate 2, in such a way that the inclination differs from an angle of 90°. A first portion 36 of LASER beams 12 is preferably oriented relative to the surface 16 at a first angle 38, and a further portion 40 of LASER beams 12 is oriented relative to the surface 16 at a second angle 42. The LASER beam portions 36 and 40 are preferably always inclined identically relative to the surface 16 via which the LASER beam portions 36, 40 penetrate the donor substrate 2, preferably so as to produce all modifications 12 produced for separating a certain solid-body layer 1. It can also be deduced from the first illustration of FIG. 4 that the focus point 48 for producing modifications 10 can be guided in the donor substrate 2 as far as the edge 44 or directly as far as the edge 44 on account of the inclined LASER beam portions 36, 40.

Illustration 2 of FIG. 1 also shows that, in accordance with the LASER beam portions 36, 40 oriented in an inclined manner, a material-removing treatment of the edge 44 of the donor substrate 2 is not necessary or is only necessary to a significantly reduced extent. The stress-inducing layer 14 arranged or produced on the surface 16 generates mechanical stresses in the donor substrate 2, whereby a crack 20 propagates in the donor substrate 2 in a manner guided very precisely from the edge 44 on account of the modifications 10 produced as far as the edge 44.

Illustration 3 of FIG. 1 shows a solid-body slice 1 completely split off from the donor substrate 2, wherein the solid-body slice 1 preferably has not experienced any edge treatment in accordance with this embodiment.

Illustration 4 of FIG. 1 shows that a solid-body slice 1 can be removed from the donor substrate 2 likewise by producing modifications 10 by means of LASER beams 36, 40 (without a stress-inducing layer 14).

The present invention thus relates to a method for separating solid-body slices 1 from a donor substrate 2. The method according to the invention comprises the following steps:

providing a donor substrate 2, producing modifications 10 within the donor substrate 2 by means of LASER beams 12, wherein the LASER beams 12 penetrate the donor substrate 2 via a planar surface 16 of the donor substrate 2, wherein the totality of LASER beams 12 is inclined relative to the planar surface 16 of the donor substrate 2 in such a way that a first portion 36 of the LASER beams 12 penetrates the donor substrate 2 at a first angle 38 relative to the planar surface 16 of the donor substrate 2 and at least one further portion 40 of the LASER beams 12 penetrates the donor substrate 2 at a second angle 42 relative to the planar surface 16 of the donor substrate 2, wherein the value of the first angle 38 differs from the value of the second angle 42, wherein the first portion 36 of LASER beams 12 and the further portion 40 of LASER beams 12 are focused in order to produce the modification 10 in the donor substrate 2, wherein the solid-body slice 1 detaches from the donor substrate 2 as a result of the modifications 10 produced or a stress-inducing layer (14) is produced or arranged on the planar surface (16) of the donor substrate (2) and mechanical stresses are produced in the donor substrate (2) by a thermal treatment of the stress-inducing layer (14), wherein the mechanical stresses produce a crack (20) for separating a solid-body layer (1), which crack propagates along the modifications (10).

Figure 2:
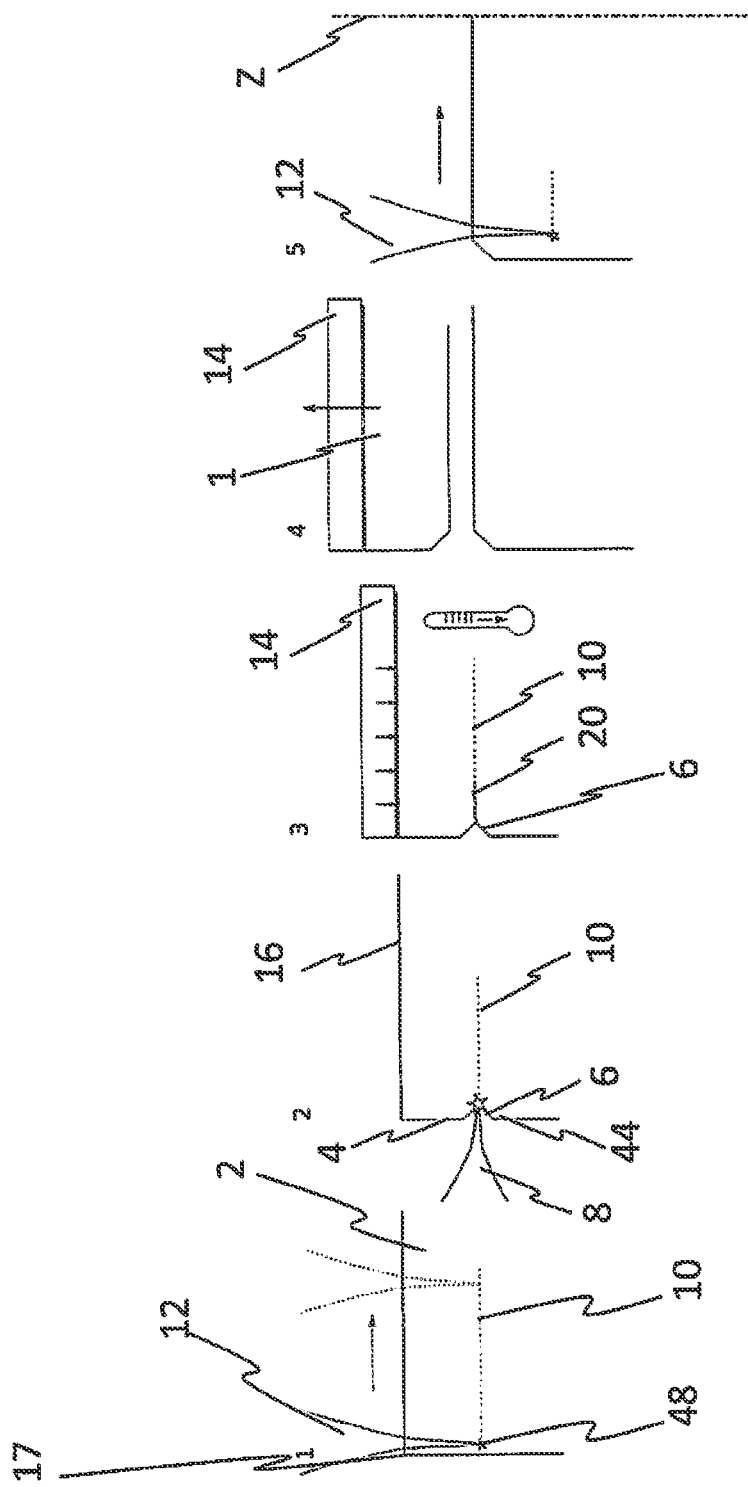
FIG. 2 shows a further example of an edge treatment within the scope of the solid-body slice production or solid-body layer production according to the invention.

FIG. 2 shows a further variant of the method according to the invention. By means of a comparison of the first and fifth illustration, it can be seen that the modifications 10 produced by means of the LASER beams 12, in the case of a planar surface 16, can be produced closer to the edge 44 than if the tip of the edge 17 of the surface 16 is removed, as shown in the fifth illustration. The LASER beams 12 here penetrate the donor substrate 2, similarly to the modification production explained with reference to FIG. 1.

The second illustration of FIG. 2 shows the production of an indentation 6 starting from a peripheral surface 4 in the direction of the centre Z of the donor substrate 2, wherein the indentation is produced by means of ablation LASER beams 8 of an ablation LASER (not shown). The ablation LASER beams 8 here preferably evaporate the material of the donor substrate 2 in order to produce the indentation 6.

According to illustration 3 of FIG. 2 the form of the indentation is not asymmetrical, but instead is symmetrical. In accordance with this illustration as well, a stress-inducing layer 14 is produced or arranged on the donor substrate 2 and is thermally treated, in particular by means of liquid nitrogen, in order to produce mechanical stresses for initiating a crack 20.

Illustration 4 of FIG. 2 shows the solid-body slice 1 split off from the donor substrate 2, with the stress-inducing layer still arranged on said solid-body slice.

It can also be seen from illustration 5 of FIG. 2 that in the case of a donor substrate 2 of which the tip of the edge 17 is processed, the indentation 6 to be produced by means of ablation LASER beams 8 must reach further in the direction of the centre of the donor substrate 2 than if the tip of the edge 17 is not processed. Here, however, it is also conceivable that the indentation is not produced by means of ablation LASER beams 8, but instead by means of a grinding tool 122 (as is known for example from FIG. 1).

Figure 3B:
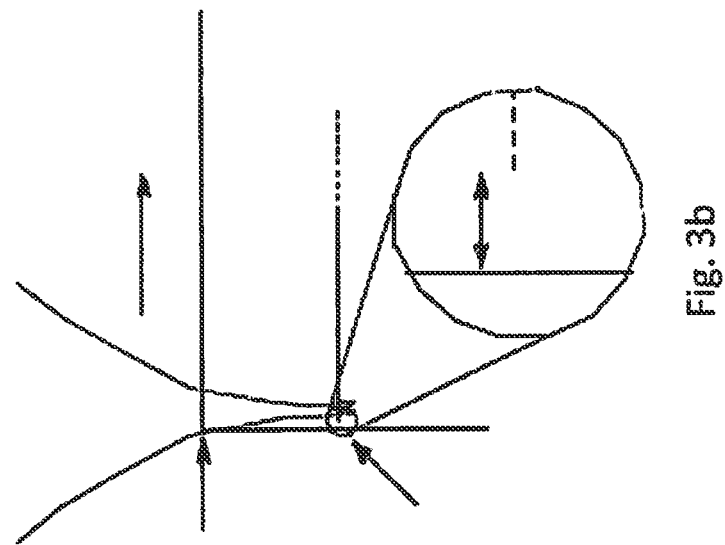
FIGS. 3a and 3b show illustrations that show the problems that occur with the production of modifications in a solid body if the modifications are produced by means of LASER beams.
Figure 3A:
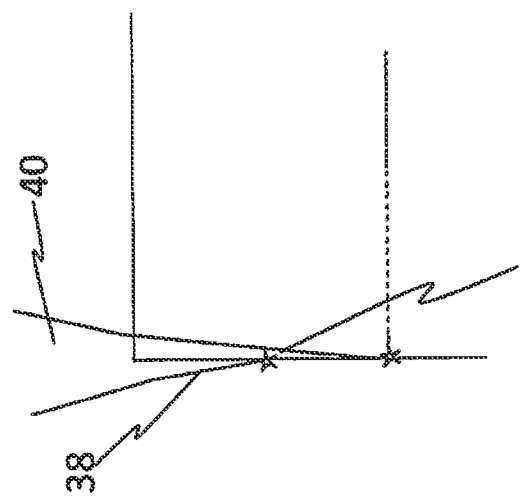

FIGS. 3a and 3b show a problem in the edge region of the donor substrate 2 occurring with the production of modifications by means of LASER beams 12. By means of the different refractive indices in the air and in the donor substrate, the LASER beam portions 38, 40 of a LASER beam 12 do not coincide exactly with one another, thus resulting in undesirable effects, such as the production of defects at undesirable locations, an undesirable local heating, or a prevention of the production of a modification.

FIG. 3b shows that a problem-free production of modifications 10 can be provided only if the modification 10 to be produced is distanced from the peripheral surface of the donor substrate 2 to such an extent that both LASER beam portions 38, 40 are each refracted through material with the same refractive index and preferably over the same distance. However, this means that the production of the modification, as it occurs in the region distanced from the edge region, cannot be readily extended to the edge region.

FIG. 4 shows an arrangement in accordance with which a LASER beam 12 is oriented parallel to the longitudinal axis L. This illustration additionally or alternatively also shows a LASER beam 60 inclined at an angle α1 relative to the longitudinal axis L. Both LASER beams 12 and 60 can serve here for the production of the modifications 10, by means of which a detachment region 11 is predefined. It is conceivable here that a plurality of the modifications 10 are produced by the LASER beam 12, which is not inclined relative to the longitudinal axis L, and that the modifications 10 in the edge region, that is to say at a distance of less than 10 mm, in particular of less than 5 mm or of less than 2 mm or of less than 1 mm or of less than 0.5 mm from the peripherally extending surface (peripheral surface), are produced by the LASER beam 60 inclined relative to the longitudinal axis L.

Alternatively, it is also conceivable that all modifications 10 of the detachment region or the plurality of modifications 10 of the detachment region 11 are produced by the LASER beam 60 inclined at an angle α1 relative to the longitudinal axis L.

Additionally or alternatively, within the sense of the present invention, the modifications 10 in the edge region can be produced by a further LASER beam 62, 64 inclined relative to the longitudinal axis L of the donor substrate 2, wherein this LASER beam preferably penetrates the donor substrate 2 over a peripheral surface of the donor substrate 2. It can be seen from the illustration that a LASER beam 62, for production of the modifications 10 in the edge region, can be introduced into the donor substrate 2 over the peripheral surface for example at an angle α2, which is greater than 0° and smaller than 90°, relative to the detachment region 11. It can also be seen from the illustration that a LASER beam 64, in order to produce the modifications 10, can be introduced into the donor substrate 2 over the peripheral surface of the donor substrate 2 in the direction of extent of the detachment region 11. Here, the LASER beam 64 is preferably inclined at an angle α3, between 80° and 100°, in particular 90° or substantially 90°, relative to the longitudinal axis L of the donor substrate 2.

A modification 10 can thus be produced in the region of the edge by one of the LASER beams 60, 62, 64.

Furthermore, in accordance with the invention, the statements provided with reference to FIG. 1 can be applied or transferred similarly to the subjects shown in FIG. 4, and vice versa.

Figure 5B:
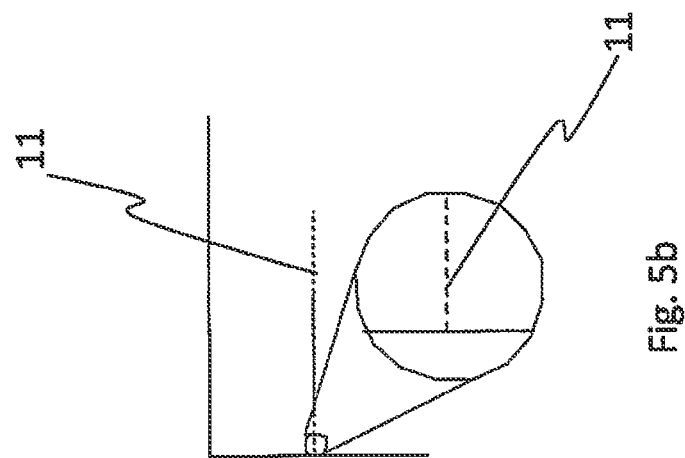
FIGS. 5a/5b show an illustration of a modification production step and a schematic illustration of the produced modifications.
Figure 5A:
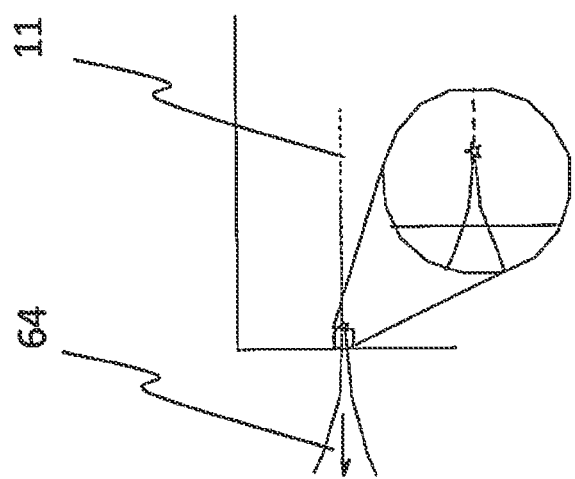

FIG. 5a shows a detachment region 11 produced just short from the edge region. FIG. 5a also shows the production of modifications by means of a LASER beam 64. A plurality of modifications 10 are preferably produced in the radial direction by the LASER beam 64, in particular over a line, with increasingly greater distances from the centre or an axis of rotation (which extends preferably orthogonally to the planar surface 16 of the donor substrate 2) of the donor wafer 2.

FIG. 5b schematically shows a state following the production of the modifications 10. In accordance with this illustration the detachment region 11 is formed as a modification layer extending completely within the donor wafer 2.

FIGS. 6a and 6b show two variants for producing modifications 10 by means of LASER beams introduced over the peripheral surface.

In accordance with FIG. 6a, a multiplicity of modifications 10 are produced over the same penetration point, through which the LASER beams 64 penetrate the donor substrate 2. The LASER beams are focused into the donor substrate 2 at different depths in the radial direction in order to produce the modifications 10. The modifications 10 are preferably produced with decreasing penetration depth of the LASER beams or with increasingly shorter distance of the focus point from the penetration point.

FIG. 6b shows the filament-like production of modifications. The modifications 10 produced in the form of filaments are longer then a multiple of their cross-sectional extent, in particular for example 10 times, 20 times, or 50 times longer.

FIG. 7 shows a LASER device 46, an aberration means 47, and a sectional illustration of a donor substrate 2. The detailed illustration of FIG. 7 shows the LASER beam 12 penetrating the donor wafer 2 over the curved peripheral surface of the donor wafer 2, wherein the course of the radiation adapted by means of the aberration means 47 is illustrated by the dashed lines.

The present invention therefore relates to a method for separating solid-body slices 1 from a donor substrate 2. The method according to the invention comprises the following steps: providing a donor substrate 2, producing at least one modification 10 within the donor substrate 2 by means of at least one LASER beam 12, wherein the LASER beam 12 penetrates the donor substrate 2 over a planar surface 16 of the donor substrate 2, wherein the LASER beam 12 is inclined relative to the planar surface 16 of the donor substrate 2, in such a way that it penetrates the donor substrate at an angle that is unequal to 0° or 180° relative to the longitudinal axis of the donor substrate, wherein the LASER beam 12 is focused in order to produce the modification 10 in the donor substrate 2, wherein the solid-body slice 1 detaches from the donor substrate 2 by the produced modifications 10 or a stress-inducing layer 14 is produced or arranged on the planar surface 16 of the donor substrate 2 and mechanical stresses are produced in the donor substrate 2 by a thermal treatment of the stress-inducing layer 14, wherein a crack 20 for separating a solid-body layer 1 is produced by the mechanical stresses and propagates along the modifications 10.

Figure 8:
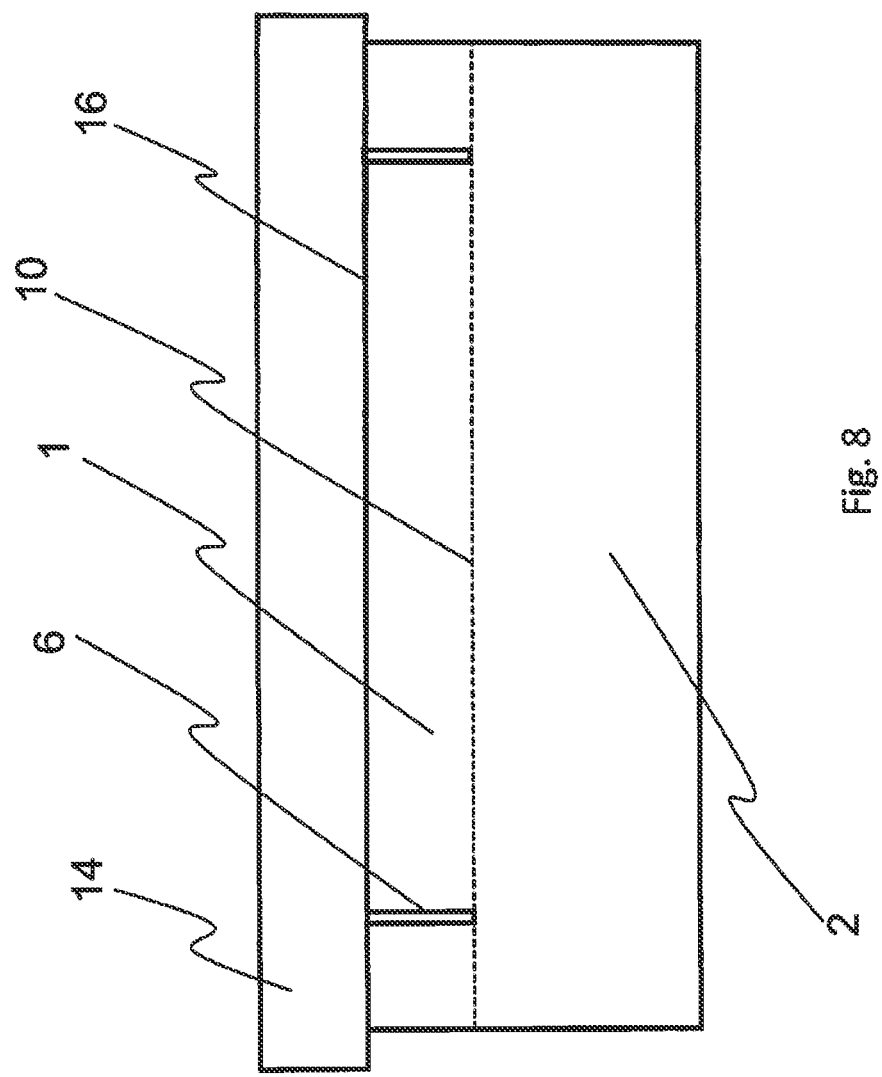
FIG. 8 shows a schematic illustration of a solid body that has indentations covered or superimposed or closed by a stress-inducing layer.

FIG. 8 schematically shows an arrangement in accordance with which the stress-inducing layer 14 preferably superimposes or covers or closes at least one indentation 6, in particular a recess or hollow cavity, which extends preferably starting from a planar or substantially planar surface 16 in the direction of a further surface of the solid body 2, which further surface is preferably parallel to the planar surface 16.

The stress-inducing layer 14 is preferably produced as a polymer layer or is produced as a layer that consists predominantly in terms of proportions by mass and/or proportions by volume of at least one polymer material. The surface 16 on which the stress-inducing layer 14 is arranged preferably has treated portions. Here, 'treated portions' is preferably understood to mean portions in which material has been removed. One or more indentations, in particular recesses 6 and/or hollow cavities 6, thus preferably extend preferably orthogonally to the surface and/or the crack-forming layer, starting from the surface 16 on which the stress-inducing layer 14 is arranged and which preferably extends substantially or completely parallel to a crack-forming layer formed from modifications 10. Here, it is alternatively conceivable that only one indentation 6, in particular a hollow cavity and/or a recess, has been produced and/or is formed by means of material removal. The material removal is preferably performed, in particular by means of laser ablation, before the production or attachment of the stress-inducing layer 14 on the surface 16. The stress-inducing layer 14, in the state coupled or connected to the solid body 2, covers the indentation (s) 6, in particular the hollow cavity or the hollow cavities or the recess or the recesses.

There is preferably no further coating, in particular no further material application, between the production of the indentation 6, in particular the recess and/or the hollow cavity, and the attachment of the stress-inducing layer. This is advantageous since otherwise material could accumulate in the recess/hollow cavity.

The stress-inducing layer is preferably attached by means of a plasma lamination process. This is advantageous since a connection between the solid body 1, in particular the main surface 16 of the later solid-body layer 1, and the stress-inducing layer 14 can thus be produced over the indentation 6, in particular recess/hollow cavity. The connection is preferably a lamination or adhesive bonding. It is preferably implemented with use of cold plasma.

Additionally or alternatively, a "spontaneous split" with previously produced laser plane or crack-forming plane and depth modification can be brought about in accordance with the invention by a material removal step, in particular laser ablation. This is preferably implemented without stress-inducing layer 14.

The stress-inducing layer 14 can also be referred to as a stressor layer, in particular as a self-supporting stressor layer.

In accordance with the invention it has also been found that a self-supporting stressor layer is of significant technical advantage compared to a stressor layer applied by vapour deposition or applied by some other form of deposition, since stressor layers of this kind can be produced on the one hand in larger volume in simpler methods in specialised facilities with a higher throughput and on the other hand can be used in lamination processes, which likewise allow quicker process speeds. In addition, self-supporting stressor layers can also be removed again from the substrate following lamination processes, even with little effort, which for example also allows re-use, i.e. of the stressor layer or of the stress-inducing layer, which is not possible with deposited layers.

It is particularly advantageous that lamination processes can also be performed without adhesive bonding methods or the like purely by a surface activation, surface treatment, or surface modification of the substrate. A coupling or connection of the stress-inducing layer to the solid body, in particular to the surface 16 of the later solid-body layer 1, is thus achieved particularly preferably by a surface activation and/or surface treatment and/or surface modification of the solid body or the surface 16 of the later solid-body layer 1.

For example, the surface can preferably be activated by contact with, in particular in a chamber, produced ozone and/or by ultraviolet light of a certain wavelength and/or by plasma methods with different formed species on the surfaces of the substrate and/or the stressor layer and/or in the process gas, in particular radical aldehyde and alcohol species. Here, hot plasma methods are preferred in particular, in which high temperatures are used in order to produce free charge carriers and radicals in the plasma, which, for the subsequent reactions at the surfaces of substrate and stressor layer, allows other reaction paths and chemical surface reactions compared to lower temperatures. The surface modification mechanism can thus differ in a temperature-dependent manner, also between various substrates, wherein for example in the case of SiC, compared to Si, the carbon atoms involved can form different surface species in the plasma treatment which can likewise have an adhesion-promoting effect in the lamination process.

Alternatively, the use of a cold plasma method is possible, in which a plasma is not produced by thermionic emission or via hot tungsten filaments or similar methods, but instead via piezoelectric transformers at atmospheric pressure and preferably without elevated temperatures. These lower temperatures likewise reduce and/or change the available reaction paths for surface activations and surface modifications for adhesion promotion in lamination processes, both at the substrate or the solid body and at the stressor layer. The resultant surface species are thus dependent on a multiplicity of parameters and the surface activation method in particular.

The surface treatment or modification for example comprises the exposure, at least in portions, of the surface to be treated by a corona treatment and/or a flame treatment and/or a treatment by means of electrical barrier discharge and/or fluorination and/or by ozonisation and/or by excimer irradiation and/or by a treatment with a plasma, wherein individual or a plurality of physical parameters, such as the type of plasma, the path distance during the plasma treatment, the nozzle type, the nozzle distance and/or the duration of the plasma treatment, are preferably varied or can be varied.

A plasma pre-treatment or plasma treatment is preferably used both for cleaning and then for homogenisation of the surface species (for example hydrophobising, amongst others).

A spatially resolved variation of the surface activation can be produced or adjusted by means of a selective individual plasma treatment and then allows a lamination of the stressor layer, likewise with different properties in different areas, if desired.

The process of the plasma surface activation or of the plasma surface treatment allows a greater influencing in order to apply the desired differentiated adhesion or force transfer after the lamination of the stressor layer on the substrate also over large areas in a defined symmetrical or asymmetrical form. Here, by means of process variation, an amended adhesion or cohesion can be set, in particular locally. Depending on the starting properties of the different solid-body materials, in particular semiconductor materials, layers can be applied and/or the desired auxiliary layer (s), in particular sacrificial/damage layers or substrate and/or stressor layer surfaces, can be selectively modified (hydrophobic, hydrophilic, wetting, etc.) by further gradual process gases (oxygen, amongst others). This leads to a spatially resolved, adapted gradual adhesion or spatially resolved adapted or adjusted force transfer connection, also in lamination processes, which is only homogeneous and not spatially resolved compared to that by adhesive bonding and deposition solutions for the stressor layer.

As already described, different physical parameters can be used during the plasma treatment (for example plasma type, path distance during the plasma treatment, nozzle type, nozzle distance, duration of the plasma treatment). In addition to these influencing parameters, a greater bandwidth of the necessary surface properties can be provided by selective admixing of gradual process gases, such as nitrogen, oxygen, hydrogen, SiH4, Si (EtO)4 or Me3SiOSiMe3 (amongst others). These result preferably from new chemical surface species, which deposit themselves on the semiconductor surface and/or the adjoining sacrificial layers and/or the stressor layer and thus enable a different surface functionality and lamination process properties. This leads to the desired target profiles, for example different spatially resolved adhesion cohesion and properties, of the semiconductor surfaces and/or the adjoining stressor and/or other layers.

A corona treatment is an electrochemical method for surface treatment or modification of plastics. Here, the surface is exposed to an electric high-voltage discharge. A corona treatment is used for example to promote adhesion in plastics and films, amongst others (PE, PP).

In the case of a flame treatment a surface-near oxidation of the respective compounds takes place in particular. In principle, oxidation processes are performed, by means of which different polar functional groups are formed (for example oxides, alcohols, aldehydes, carboxylic acids, esters, ethers, peroxides) depending on the material and test conditions.

A treatment by dielectric barrier discharge (DBE, AC voltage gas discharge, also DBD treatment) is similar to a low-temperature plasma or glow discharge (for example GDMS). In the case of DBE treatment the surface is acted on by unipolar or bipolar pulses with pulse durations of a few microseconds down to tens of nanoseconds and amplitudes in the single-digit kilovolt range. A dielectric barrier discharge is advantageous since no metal electrodes are anticipated in the discharge chamber, and therefore no metal contaminations or electrode wear is anticipated.

Further advantages of the dielectric barrier discharge, depending on application, for example can be that it has a high efficiency, since no charge carriers have to exit or enter at the electrodes (omission of the cathode drop, no glow emission necessary), or that the dielectric surfaces can be modified and chemically activated at low temperatures. The surface modification is performed here preferably by an interaction and reaction of the surface species by ion bombardment and the effect of ultraviolet radiation on the surface species (for example 80 nm-350 nm, incoherent UV and VUV light, by high-frequency power generators). The dielectric barrier discharge is used for example for in situ production of ozone in drinking water/wastewater treatment, wherein the water is ozonised by the ozone. Similarly, in the case of a surface treatment or modification according to the invention by means of ozonisation, the surface to be treated is acted on by ozone.

A surface treatment or modification by means of halogenation, in particular fluorination, causes an element or a compound to be converted into a halide. By means of the fluorination, fluorine is thus introduced into preferably organic compounds with the aid of fluorinating agents.

A surface treatment or modification by means of UV treatment is performed preferably by excimer irradiation or by ultraviolet light-emitting diode sources, for example based on aluminium nitride. Excimer irradiation is performed by the use of at least one excimer LASER. Excimer LASERs are gas LASERs which can generate electromagnetic radiation in the ultraviolet wavelength range. A gas discharge occurring in this case is thus caused by an electromagnetic high-frequency field. There is thus also no need for any electrodes for the gas discharge. The produced UV radiation lies preferably in a wavelength range between 120 nm and 380 nm.

REFERENCE LIST 1 solid-body slice
2 donor substrate
4 surface extending in the peripheral direction
6 indentation
8 ablation LASER beams
10 modifications
12 further LASER beams
14 stress-inducing layer
16 planar surface
17 edge
18 indentation end
20 crack
22 grinding tool
24 first processing portion
26 second processing portion
28 underside
30 upper side
32 main grinding face
34 secondary grinding face
36 first portion of LASER beams
38 first angle
40 further portion
42 second angle
44 edge
46 LASER device
48 LASER focus

The invention claimed is:

1. A method for separating a solid-body layer from a donor substrate, said method comprising:
   providing a donor substrate having a planar surface, a normal axis orthogonal to the planar surface, and a peripheral surface;
   producing a plurality of modifications within the donor substrate using at least one LASER beam, wherein the at least one LASER beam penetrates the donor substrate via the peripheral surface at an angle not equal to 90° relative to the normal axis of the donor substrate;
   producing a stress-inducing polymer layer on the planar surface of the donor substrate; and
   producing mechanical stresses in the donor substrate by a thermal treatment of the stress-inducing polymer layer, wherein the mechanical stresses produce a crack for separating the solid-body layer, and wherein the crack propagates along the modifications.

2. The method of claim 1, wherein a first LASER beam penetrates the donor substrate via the peripheral surface at a first angle which is greater than 0° and smaller than 90°, relative to the normal axis of the donor substrate, and wherein a second LASER beam penetrates the donor substrate via the peripheral surface at a second angle different than the first angle, relative to the normal axis of the donor substrate.

3. The method of claim 2, wherein the second angle is between 80° and 100°, relative to the normal axis of the donor substrate.

4. The method of claim 3, wherein the second angle is 90° or substantially 90°, relative to the normal axis of the donor substrate.

5. The method of claim 2, wherein a third LASER beam penetrates the donor substrate via the planar surface inclined at an angle relative to the normal axis, and wherein a modification is produced in a region of an edge of the donor substrate by one of the first, second and third LASER beams.

6. The method of claim 1, wherein the stress-inducing polymer layer comprises polydimethylsiloxane.

7. A method for separating a solid-body layer from a donor substrate, said method comprising:

providing a donor substrate having a planar surface, a normal axis orthogonal to the planar surface, and a peripheral surface;

producing a first plurality of modifications within the donor substrate by means of at least one first LASER beam, wherein the at least one first LASER beam penetrates the donor substrate via the planar surface;

producing a second plurality of modifications within the donor substrate by means of at least one second LASER beam, wherein the at least one second LASER beam penetrates the donor substrate via the peripheral surface at an angle not equal to 90° relative to the normal axis of the donor substrate; and producing stresses in the donor substrate to produce a crack for separating the solid-body layer, wherein the crack propagates along the first and second pluralities of modifications.

8. The method of claim 7, wherein an angle at which the at least one first LASER beam penetrates the donor substrate via the planar surface is between 80° and 100°, relative to the normal axis of the donor substrate.

9. The method of claim 8, wherein the angle at which the at least one first LASER beam penetrates the donor substrate via the planar surface is 90° or substantially 90°, relative to the normal axis of the donor substrate.

10. The method of claim 8, wherein a third LASER beam penetrates the donor substrate via the planar surface inclined at an angle relative to the normal axis.

11. The method of claim 7, wherein producing the stresses in the donor substrate comprises:
producing a stress-inducing polymer layer on the planar surface of the donor substrate; and
applying a thermal treatment to the stress-inducing polymer layer.

12. The method of claim 11, wherein the stress-inducing polymer layer comprises polydimethylsiloxane.

13. A method for separating a solid-body layer from a donor substrate, said method comprising:
providing a donor substrate having a planar surface, a normal axis orthogonal to the planar surface, and a peripheral surface;

producing a plurality of modifications within the donor substrate using at least one LASER beam, wherein the at least one LASER beam penetrates the donor substrate via the peripheral surface, wherein a first portion of the at least one LASER beam penetrates the donor substrate at a first angle relative to the normal axis and at least one further portion of the at least one LASER beam penetrates the donor substrate at a second angle relative to the normal axis, wherein the value of the first angle differs from the value of the second angle, wherein the first portion and the at least one further portion of the at least one LASER beam are focused in order to produce the modifications in the donor substrate; and producing stresses in the donor substrate to produce a crack for separating the solid-body layer, wherein the crack propagates along the plurality of modifications.

14. The method of claim 13, wherein the first angle is greater than 0° and smaller than 90°, relative to the normal axis of the donor substrate.

15. The method of claim 14, wherein the second angle is between 80° and 100°, relative to the normal axis of the donor substrate.

16. The method of claim 15, wherein the second angle is 90° or substantially 90°, relative to the normal axis of the donor substrate.

17. The method of claim 13, wherein at least one additional LASER beam penetrates the donor substrate via the planar surface inclined at an angle relative to the normal axis.

18. The method of claim 13, wherein producing the stresses in the donor substrate comprises:
producing a stress-inducing polymer layer on the planar surface of the donor substrate; and
applying a thermal treatment to the stress-inducing polymer layer.

19. The method of claim 18, wherein the stress-inducing polymer layer comprises polydimethylsiloxane.

* * * * *